United States Patent [19]

Fujita

[11] Patent Number: 4,596,978
[45] Date of Patent: Jun. 24, 1986

[54] PARALLEL COMPARISON TYPE ANALOG TO DIGITAL CONVERTER

[75] Inventor: Tsuneo Fujita, Tokyo, Japan

[73] Assignee: NEC, Tokyo, Japan

[21] Appl. No.: 590,618

[22] Filed: Mar. 19, 1984

[30] Foreign Application Priority Data

Mar. 18, 1983 [JP] Japan ................................. 58-45471

[51] Int. Cl.⁴ ............................................. H03M 1/00
[52] U.S. Cl. ......................... 340/347 AD; 340/347 M
[58] Field of Search ................................. 340/347 AD

[56] References Cited

U.S. PATENT DOCUMENTS

| | | | |
|---|---|---|---|
| 4,183,016 | 1/1980 | Sawagata | 340/347 AD |
| 4,251,802 | 2/1981 | Horna | 340/347 AD |
| 4,393,372 | 7/1983 | Hoehn | 340/347 AD |

FOREIGN PATENT DOCUMENTS

| | | | |
|---|---|---|---|
| 2222800 | 10/1974 | France | 340/347 AD |
| 0058323 | 5/1981 | Japan | 340/347 AD |
| 0204633 | 12/1982 | Japan | 340/347 AD |
| 0142622 | 8/1983 | Japan | 340/347 AD |

Primary Examiner—Bernard Roskoski
Assistant Examiner—Sharon D. Logan
Attorney, Agent, or Firm—Sughrue, Mion, Zinn, Macpeak & Seas

[57] ABSTRACT

A parallel comparison type A/D converter which can produce a digital output with improved monotonic operation.

The A/D converter comprises a plurality of comparators for comparing an analog signal with a plurality comparison voltage, and a plurality of logic gates each having a first input terminal of a positive logic and a second input terminal of a negative logic, one of the first and second input terminals receiving an outpt signal from one of the comparators of a certain weight and the other of the first and second input terminals receiving an output signal from the comparator having a weight subsequent to the certain weight. The threshold values of the first and second input terminals are made different from each other.

17 Claims, 7 Drawing Figures

|     | 154 | 153 | 152 |
|-----|-----|-----|-----|
| 147 | 1   | 0   | 0   |
| 146 | 1   | 0   | 1   |
| 145 | 1   | 1   | 1   |
| 144 | 1   | 1   | 0   |
| 143 | 0   | 1   | 0   |
| 142 | 0   | 1   | 1   |
| 141 | 0   | 0   | 1   |
| 140 | 0   | 0   | 0   |

PARALLEL COMPARISON TYPE ANALOG TO DIGITAL CONVERTER

FIELD OF THE INVENTION

The present invention relates to an analog to digital converter (hereinafter abbreviated as "A/D" converter) for converting an analog signal to a digital signal, and particularly to a parallel comparison type A/D converter.

Parallel comparison type A/D converters have been widely utilized in various fields such as video systems and audio systems.

The principle of operation of parallel comparison type A/D converters is as follows. An analog signal to be converted into a digital signal is simultaneously compared in a plurality of comparison circuits with a plurality of comparison voltages, respectively, each having a different value. The comparison circuits which receive comparison voltages of higher values than the analog signal generate output signals of a first logic level, e.g., "1", while the comparison circuits which receive comparison voltages of lower values than the analog signal generate output signals of a second logic level e.g., "0". The output signals are applied to a corresponding plurality of logic gates in such a manner that the logic gates determine which comparison voltage is closest to the analog signal. An output of only one of the logic gates is activated, e.g., binary "1", while outputs of the remaining logic gates are not activated. The particular logic gate having the activated output corresponds to the value of the analog signal. The outputs of the logic gates are applied to a decoder and a binary code representing the value of the analog signal.

One problem with such parallel comparison A/D converters is caused by the fact that a typical comparison circuit is not sufficiently sensitive to clearly distinguish which of its two inputs is greater when the two inputs are very close in value. In such case the comparison circuit provides an intermediate level output voltage, "X", which is intermediate the binary levels "0" and "1". This in turn causes a malfunction of the logic gates resulting in all of the logic gates having the same output, e.g., "0". The decoder provides an output code incorrectly representing the value of the analog signal. Thus, as the analog input varies in one direction, e.g., increases, the binary code output may jump up or down from its correct value each time the analog signal nears a comparison voltage.

Thus, it has been difficult to obtain ideal monotonic operation in the A/D conversion characteristics of such converters. Namely, the digital output cannot change in proportion to the value of the analog signal throughout the whole conversion range of the analog signal.

The disadvantage described above is fatal to the A/D converters. Namely, when the A/D converter is used to convert an analog signal such as an audio or video signal, which changes continuously in value, an output digital signal becomes noisy. One possible way to overcome the above disadvantage is to increase the sensitivity of the comparison circuits so that the outputs will never have an intermediate value. However, the number of the comparators used in parallel comparison type A/D converters is very large (for example, $2^N$ comparators are required for an A/D converter of an N-bit output structure), and a large number of circuit elements such as field effect transistors is required to obtain high sensitivity. Therefore, it has been difficult and impractical to form a parallel comparison type A/D converter having very highly sensitive comparators on a limited area of a semiconductor chip.

SUMMARY OF THE INVENTION

It is an object of the present invention to provide a parallel comparison type A/D converter having improved monotonic operation in A/D conversion characteristics.

It is another object of the present invention to provide a parallel comparison type A/D converter which can be fabricated as a high density structure in a semiconductor integrated circuit.

A parallel comparison type A/D converter according to the present invention comprises an ordered plurality of comparators, each having different weight and comparing an analog signal with a comparison voltage corresponding to its weight, and a plurality of logic gates for determining the closest weight to the analog signal, each of the logic gates having a first input terminal of a positive logic and a second input terminal of a negative logic, the first input terminal receiving an output signal from one of the comparators having a certain weight, and the second input terminal receiving an output signal from the comparator having the subsequent weight to the certain weight, and is featured that threshold values of the first and second input terminals are made different from each other.

According to the present invention, if the comparator generates an output signal of an intermediate value which is not classified into either of two binary logic levels, such an output signal of the intermediate level is necessarily recognized as one of the binary logic signals by at least one of the first and second input terminals.

Accordingly, any problem caused by the output of the intermediate value from the comparator can be effectively avoided.

DETAILED DESCRIPTION OF THE INVENTION

Figure 1:
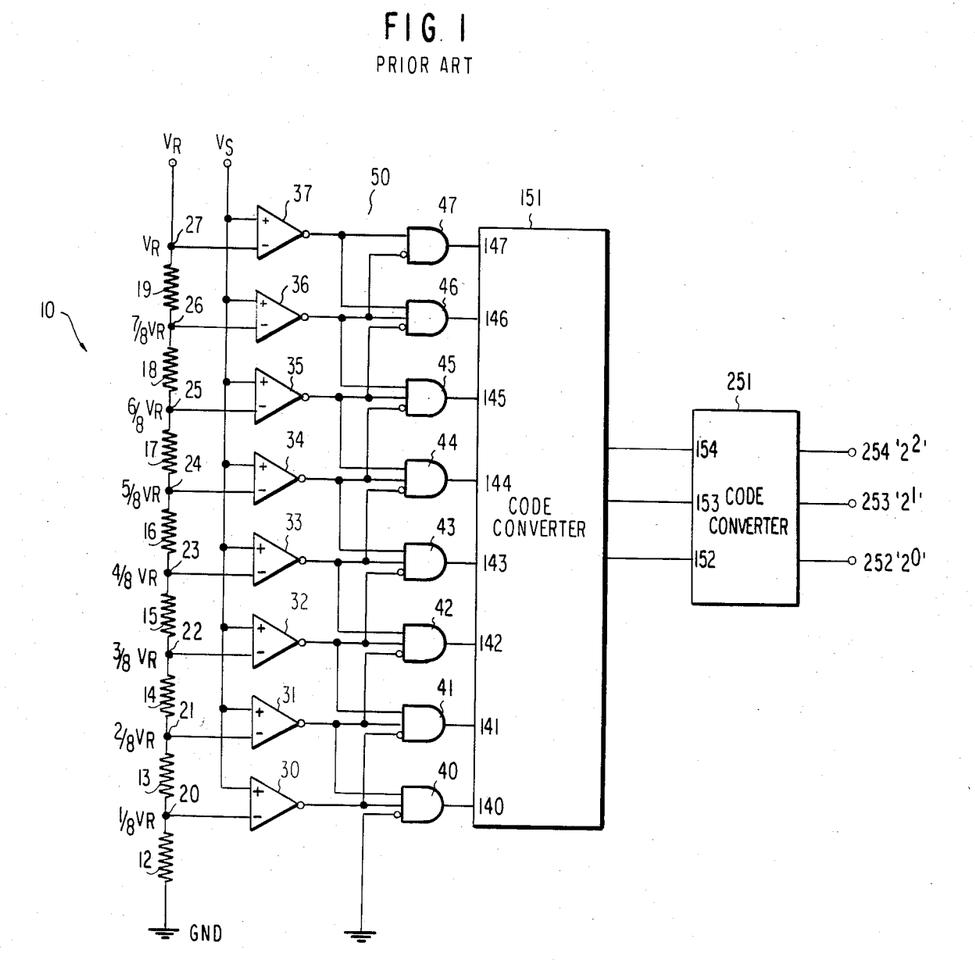
FIG. 1 is a block diagram showing the construction of a conventional parallel comparison type A/D converter.

With reference to FIG. 1, a parallel comparison type A/D converter according to the prior art will be explained.

In this example, an analog signal is converted into a 3-bit digital or binary signal. A voltage dividing circuit 10 is connected between a reference voltage $V_R$ and a ground potential GND. The voltage dividing circuit 10 consists of a plurality of resistors 12 to 19, in which a plurality of divided voltages are derived from nodes 20 to 27 between the respective resistors. The output nodes 20 to 27 of the voltage dividing circuit 10 are connected to inverted input terminals (−) of a plurality of comparators 30 to 37, respectively. An analog signal $V_S$ is applied in common to uninverted terminals (+) of the comparators. A position detecting logical circuit 50 consists of a plurality of logic gates 40 to 47, and the outputs of this circuit 50 are connected to a first code converter 151. The outputs of the first code converter 151 are applied to a second code converter 251 generating a 3-bit digital output 252 to 254.

As will be appreciated, the voltage divider provides a plurality of comparison voltages, with the lowest voltage being at node 20, the next highest at node 21, etc., through the highest at node 27. The comparison voltages will be referred to herein as an ordered plurality of comparison voltages for the purpose of describing the relationships between the comparison voltages, a like ordered plurality of comparison circuits 30–37, and a like ordered plurality of logic circuits.

For example the order of the comparison voltages is, node 20 is the first, node 21 the second, node 22 the third. Each comparison circuit, e.g., 33, receives the comparison voltage, e.g., at node 23, of the same order. Each logic gate, e.g., 43, receives one input at a positive logic terminal from the comparison circuit of the same order, e.g., 33, receives a second input at a negative logic input terminal from the comparison circuit which precedes it by one in the order, e.g., 32, and receives a third input at a positive logic input terminal from the comparison circuit which succeeds it by one in the order, e.g., 34.

Alternatively the elements may be described as having weights, even though all the comparison circuits and all the logic circuits may be identical. Thus, it may be said the gate 43 has a weight which is one above that of gate 42 and corresponds to the weight of comparison circuit 33 and the comparison voltage at node 23.

Figure 2A:
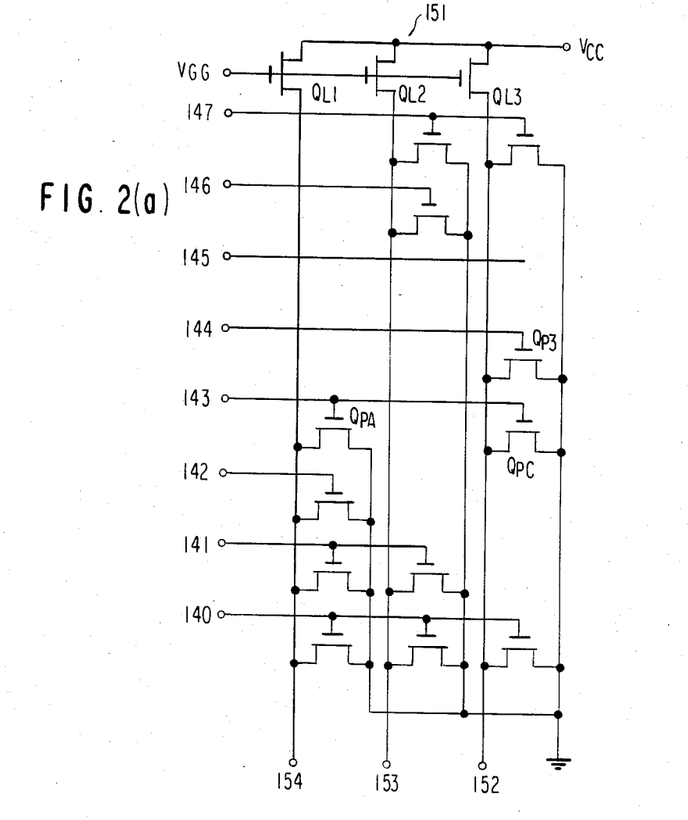
FIG. 2a shows an example of a read-only memory type code-converting circuit using Gray codes.
Figure 2B:
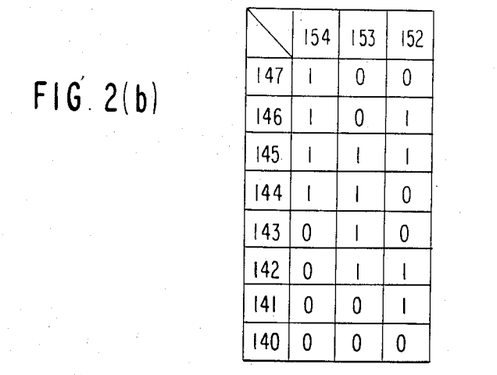
FIG. 2b shows Gray codes.
Figure 3:
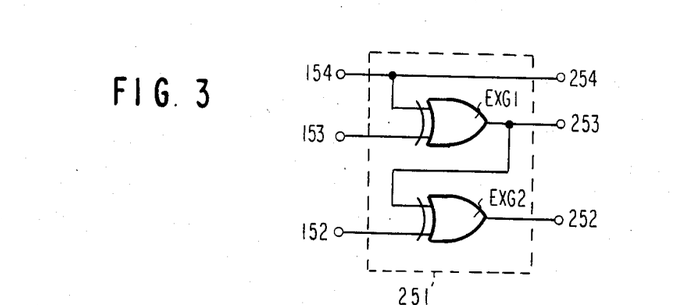
FIG. 3 shows an example of a circuit for converting Gray codes into binary codes.

The comparison voltages and the analog input voltage $V_S$ are applied to the comparison circuits 30–37 in such a way as to achieve a pattern of first and second binary level outputs therefrom whereby the order of the crossover designates the comparison voltage nearest and just above the analog input voltage. That is, each comparison circuit which receives a comparison voltage below the analog input voltage will output a first binary level signal, e.g., "0"; each comparison circuit which receives a comparison voltage above the analog output voltage will output a second binary level signal, e.g., "1". For example, assuming the analog input is between the values of voltage at nodes 23 and 24, circuits 30–33 will output "0" binary levels while circuits 34–37 will output "1" binary levels. Logic gate 44 will be the only gate activated and will thus be the only logic gate providing a binary "1" level output to the code converter 151. The "order of the crossover" refers to the position of the change from "0" outputs to "1" outputs from the plurality of comparison circuits. The outputs from the position detecting logical circuit 50 are decoded in the first code converter 151 to obtain 3-bit digital signals. The first code converter 151 may consist of a read-only memory (ROM) shown in FIG. 2a, the codes of which produce a binary Gray code output as shown in tabular form in FIG. 2b. The Gray code is converted into a regular binary code by the second code converter 251 to obtain an analog-digital converted output corresponding to the analog input voltage $V_S$. The second code converter 251, which is adapted to convert Gray code into the binary code, may consist of exclusive OR gates EXG1 and EXG2 as shown in FIG. 3.

The Gray code converter 151 has the disadvantage that when the outputs of the gates 40 to 47 are all "0" level, a certain special code is output therefrom. As illustrated that code is 111, the same as would occur if logic gate 145 provided a binary "1" at its output.

As long as there is a clearly defined crossover in the output pattern of the comparison circuits no problem occurs. However, when there is no clearly defined crossover, i.e., when one of the comparison circuits outputs an intermediate level voltage, X, it is possible that none of the gates will output a "1" and the Gray code converter will output 111 irrespective of the true value of the analog signal. Why this occurs will now be explained.

Assume, for example, the analog input is too close to the voltage at node 23 for comparison circuit 33 to distinguish between them. Its output will be at the intermediate level X. That level X will be applied to gates 44, 43 and 42. Gates 40, 41 and 42 will all have "0" outputs because comparison circuits 30, 31 and 32 will provide "0" inputs thereto. Gates 45, 46 and 47 will all have "0" outputs because of the inverted "1" inputs applied thereto by circuits 34, 35 and 36, respectively. Which of gates 43 and 44 will provide the needed "1" output to the Gray code converter depends upon the binary threshold level of the input terminals of the gates 43 and 44. If the binary threshold levels are identical at all input terminals, as they are intended to be, both gates 43 and 44 will have the same recognition of the X level signal. That is, both will recognize the X level signal as a "0" if below the binary threshold level; both will recognize the X level signal as a "1" if above the binary threshold level. In either case, one and only one of gates 43 and 44 will output a binary 1 to the Gray code converter.

However due to a deviation in manufacturing accuracy the binary threshold levels of all inputs are not always equal to one another. If the input threshold value $V_T43$ at a positive logic input terminal (without circle 0) of the gate 43 is higher than $V_T44$ of a negative logic input terminal (with circle 0) of the gate 44 due to the deviation of manufacturing accuracy, the same input level "X" from the comparator 33 is recognized as "0" level with respect to the positive logic input terminal of the gate 43, and as "1" level with respect to the negative logic input terminal of the gate 44. Consequently, the levels of outputs from the gates 43 and 44 become "0", and none of the input terminals 40 to 47 of the Gray code converter is selected. When no input terminals of the first code converter 151 is selected, a code 111 appears at the outputs 152 to 154. Accordingly, "101" necessarily appears at the outputs of the second code converter 251.

The occurrence of this phenomenon is fatal to an A/D converter. Namely, the variation of the output binary code 011T101T100, which normally should vary 011T100, spoils the monotonic operation of the A/D converter.

Figure 4:
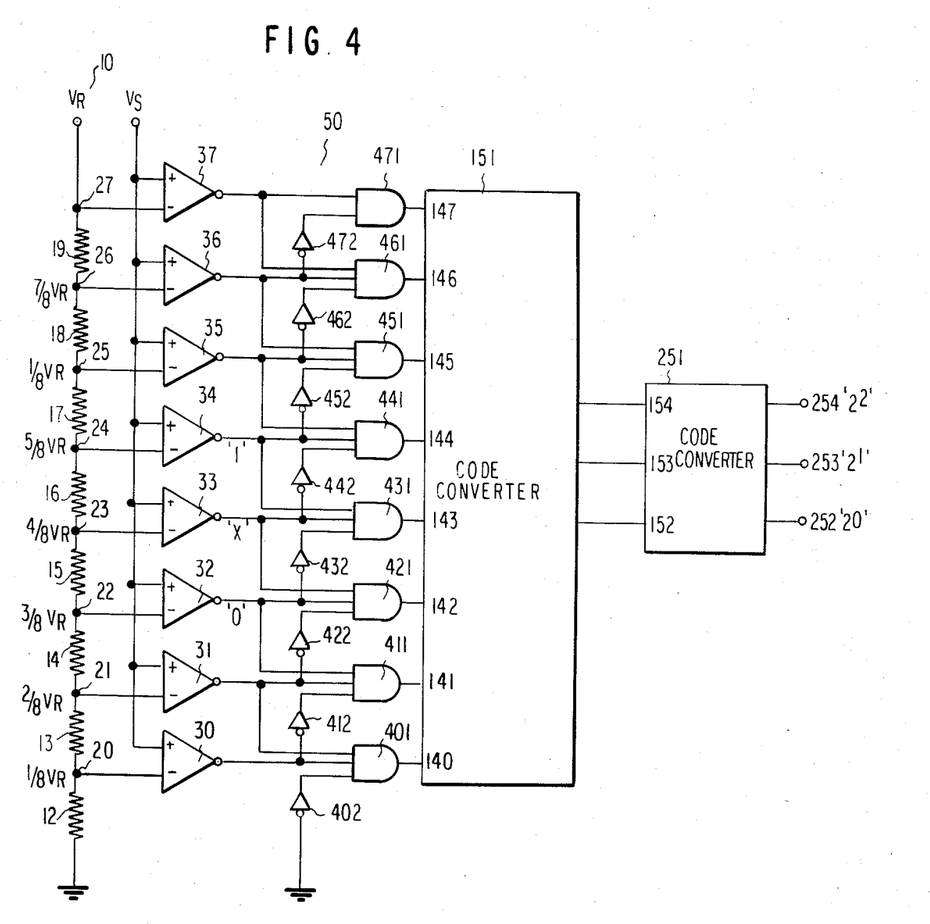
FIG. 4 is a block diagram showing a parallel comparison type A/D converter according to a first embodiment of the present invention.

In FIG. 4 a voltage dividing circuit 10 composed of 2N resistors 12 to 19 is connected between a reference voltage $V_R$ and a ground potential GND. A plurality of comparators 30 to 37 are connected to receive the voltages from nodes 20 to 27 comparison circuits so that their outputs would never be at the intermediate level.

This makes it necessary to increase the accuracy and gain of the comparators. However, as described previously, a parallel comparison type A/D converter requires $2_N$ comparators for an N-bit converter. As the number N is increased to improve the conversion accuracy, the number of comparators required increases dramatically. The circuit in such an A/D converter provided with a large number of comparators, which are required to have high accuracy and gain, is necessarily complicated and enlarged. In order to form such a parallel comparison type A/D converter into a monolithic integrated circuit, the designing thereof cannot be done easily, and, moreover, the chip area occupied by such a circuit would increase.

With reference to FIG. 4, a parallel comparison type A/D converter according to one embodiment of the present invention will be described. In FIG. 4, the portions corresponding to those in FIG. 1 are indicated by the same reference numerals as used in FIG. 1.

A voltage dividing circuit 10 composed of 2N resistors 12 to 19 is connected between a reference voltage $V_R$ and a ground potential GND. An ordered plurality of comparators 30 to 37 receive the ordered plurality of comparison voltages from nodes 20 to 27 at their inverted input terminals (−), respectively, and an analog signal $V_S$ at their uninverted input terminals (+) in common. A position detecting logic circuit 50' includes an ordered plurality of gating circuits, each consisting of an AND gate and an inverter gate; the AND gates 401–471 constituting a first logic circuit means, and the inverter gates 402–473 constituting a second logic circuit means. The function of position detecting circuit 50' is to detect a digitized location of the analog signal $V_S$ similarly to the circuit 50 in FIG. 1.

As will be appreciated, the logic of the converter of FIG. 4 is the same as that of FIG. 1. However, by separating each logic gate of FIG. 1 into an AND gate and an inverter gate, the problem described above can be easily avoided. Specifically the AND gates 401–471 are fabricated to have a first binary threshold level at a relatively low value, and the inverter gates are fabricated to have a second binary threshold level at a relatively high value.

Figure 5:
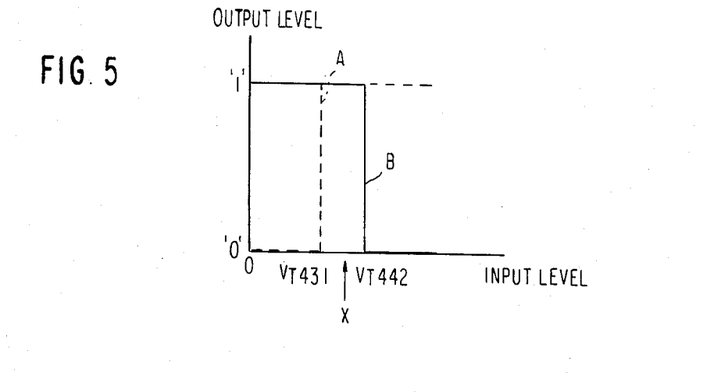
FIG. 5 shows the input and output characteristics of logic gates constituting a position-detecting logical circuit.

The input-output levels of the AND gates and invert gates are illustrated in FIG. 5; the dashed line A representing the input-output curve for the AND gates and the solid line representing the input-output curve for the invert gates. The operation will be explained for the same case as described in connection with FIG. 1, namely, that the analog signal is so close to the comparison voltage that the comparison circuit 33 does not output a definite "0" or "1", but outputs some intermediate value, X.

If the X level is below the threshold $V_{T431}$ of the AND gates (FIG. 5), it will be recognized by AND gate 431 and invert gate 442 as a binary "0". In that case, AND 441 will output a "1" just as if the analog voltage were clearly between 4/8 $V_R$ and ⅝ $V_R$. On the other hand, if the output level X from circuit 33 is above the threshold level $V_{T442}$ of the invert gates (FIG. 5), the AND gate 431 and the invert gate 442 will recognize the X level as a binary "1". In this case gate 143 will output a "1".

The third possibility is that the level X will be intermediate the threshold $VT_{431}$ of AND gate 431 and threshold $V_{T442}$ of invert gate 442. In that case, AND gate 431 will recognize the level X signal as a "1" and will output a binary "1"; invert gate 442 will recognize the level X as a "0" and will cause AND gate 441 to output a binary "1". Thus, in no case will the intermediate level result in all "0's" being output from position detection circuit 50'.

The fact that a condition can occur where two adjacent AND gates output binary "1" values is no problem. In the specific case described, both of the levels of the outputs from the logic gates 431 and 441 become "1". Therefore, as shown in FIG. 2b the Gray code "010" converted by the selective input terminal 143 and the Gray code "110" converted by the selective input terminal 144 are superposed on each other. However, the Gray code is so formed that it is varied by only one bit for each step. Accordingly, when two adjacent codes are superposed on each other, one of the two codes is always output, and they are not converted into any erroneous codes. Namely, even when the Gray codes "010", "110" are superposed on each other as in the above-mentioned case, the Gray code "010" is output. This is obvious from the structure of the circuit 251 shown in FIG. 2a. When the input terminal 143 is at the selective level ("1"), transistors QPA and QPC are made conducting so that the outputs 154 and 152 are connected to the ground potential GND to be set at "0" level. In this instance, any transistors connected to the output 153 are not made conducting. Thus, the outputs 154="0", 153="1", 152="0" are obtained. When the input terminal 144 is at the selective level ("1"), the transistor QPB is made conducting and hence the output 152 is set at ground potential while the outputs 154 and 152 are of "1" level through load transistors QL1 and QL2. Thus, the outputs (154="1", 153="1", 152="0") are generated.

Therefore, if the input terminals 143 and 144 are simultaneously set at the selection level ("1"), then the transistors QPA, QPB and QPC become conducting, and therefore the outputs (154="0", 153="1", 152="0") are obtained, which output state is the same for the case where only the input terminal 143 is selected.

One example of suitable voltages for the circuit described is as follows. The output of each of the comparators 30 to 37 swings between 0V as a logic "0" level and 5V as a logic "1" level. Therefore, the intermediate value "X" of the output of the comparator is about 2.5 V. The threshold value $V_{T431}$ of the AND gates 401–471 is about 2 V. The threshold value $V_{T442}$ of the inverter gates 402–472 is about 3 V.

According to the present invention described above, a certain output code is converted normally into a subsequent output code even when an output from a comparator has any degree of intermediate level "X"; no abnormal code is outputted.

Figure 6:
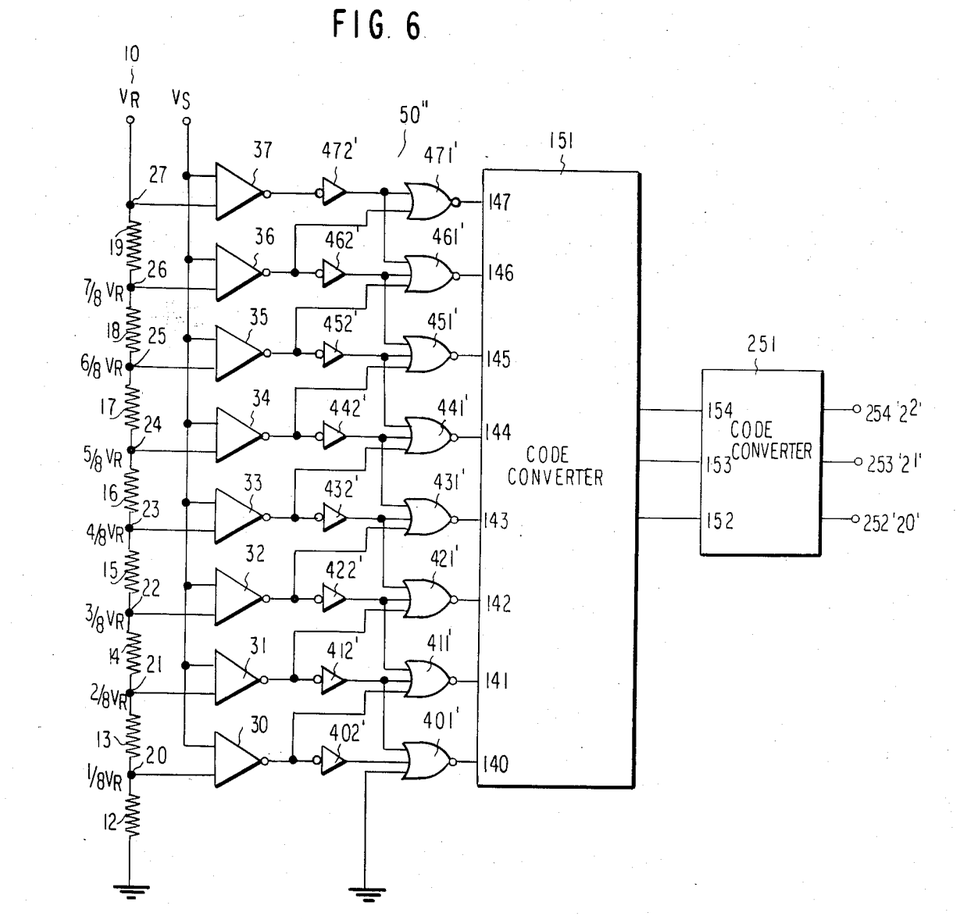
FIG. 6 is a block diagram showing a parallel comparison type A/D converter according to a second embodiment of the present invention.

With reference to FIG. 6, a parallel comparison type A/D converter according to another embodiment of the present invention will be described. Portions or circuits corresponding to those in FIG. 1 or FIG. 4 are indicated by similar reference numerals for those in FIG. 1 or 4.

In this embodiment, a position detecting circuit 50" comprises a first logic circuit consisting of invert gates 402'–472' and a second logic circuit consisting of NOR gates 401'–471'. It will be appreciated that the converter of FIG. 6 differs from that of FIG. 4 only in that the circuitry of position detector 50" is the inverse logic equivalent of the circuitry of position detector 50'. Whereas in detector 50' (FIG. 4) an AND gate (431) receives direct inputs from the comparison circuit (33)

of the same order, and from the comparison circuit (34) which succeeds it by one in the order, and receives an inverted input from the comparison circuit (32) which precedes it by one in the order, in detector 50″ (FIG. 6) a NOR gate (431′) receives inverted inputs from the comparison circuit (33) of the same order and from the comparison circuit (34) which succeeds it by one in the order, and receives a direct input from the comparison circuit (32) which precedes it by one in the order.

An input threshold value of logic input gates 401′, 411′, 421′, 431′, 441′, 451′, 461′ and 471′ is set relatively higher than that of the inverters 402′, 412′, 432′, 442′, 452′, 462′ and 472′, thereby to intentionally make these two threshold values different, so that, when an output from a comparator has an intermediate level, an output from the position-detecting logic circuit 50″ can be doubly selected by a first code converter 151.

In the present invention, a method of adjusting the threshold value of a logic gate to a desired value is not limited. Many known methods for adjusting the threshold value of logic circuits are applicable to achieve the present invention. A typical method will be explained below.

An input threshold value $V_T$ for a logic gate can generally be varied with a combination of a gate length (L) and a gate width (W) of a MOS transistor, which constitutes the logic gate. Let $L_L$ and $W_L$ be the gate length and a gate width, respectively, of a transistor operating as a load, and $L_D$ and $W_D$ be the gate length and a gate width, respectively, of a transistor operating as a driver. Then, an effective input threshold value $V_{Teff}$ for the logic gate can be expressed by the following formula.

$$V_{Teff} \alpha (W/L)_D / (W/L)_L$$

Accordingly, in order to change an input threshold value for a logic gate, only the topological shape of a MOS transistor constituting the same logic gate need be changed, and no special manufacturing step is required.

Unlike a conventional parallel comparison type A/D converter, a parallel comparison type A/D converter according to the present invention is free from the occurrence of abnormal code outputs, which is due to an insecure output from a comparator, and, therefore, it can maintain its monotonic operation. According to the present invention, comparators of a higher accuracy need not be employed for the purpose of preventing the occurrence of insecure outputs therefrom, and a large-scale complicated circuit need not be employed, either, for the purpose of enabling the comparators to have higher gain. Moreover, no other special circuits and no special manufacturing steps are required. Accordingly, the present invention can provide a reliable parallel comparison type A/D converter capable of easily forming a monolithic integrated circuit of a comparatively simple construction.

I claim:

1. A parallel comparison analog to digital converter comprising:
   a voltage dividing circuit for generating a plurality of ordered comparison voltages; and equal plurality of ordered comparison circuits for comparing said plurality of voltages, respectively, with a common analog input voltage to be digitally converted; a position detecting circuit responsive to the outputs of said plurality of comparison circuits for developing a digital output dependent upon the order of the crossover between those comparison circuits which receive a lower comparison voltage than said common analog input voltage and those comparison circuits which receive a higher comparison voltage than said common analog input voltage; said comparison circuits being of the type which produce a first binary level output when said analog input voltage is sufficiently above said comparison voltage, a second binary level output when said analog input voltage is sufficiently below said comparison voltage, and an intermediate level output when said analog input is neither sufficiently above nor sufficiently below said comparison voltage, said position detecting circuit having an equal plurality of ordered logic gates, each having a first input means adapted to receive an output of the comparison circuit of the same order and a second input means adapted to receive an output of the comparison circuit of the preceding order, said first input means having a first logic threshold value which is lower than said intermediate level output and being adapted to recognize the intermediate level output as a first binary level output, said second input means having a second logic threshold value which is above said intermediate level output and being adapted to recognize the intermediate level output as a second binary level output.

2. A parallel comparison analog to digital converter as claimed in claim 1, wherein each of said logic gates includes an AND gate receiving by the first input means the output from the comparison circuit of the same order, each of said AND gates having said first logic threshold value.

3. A parallel comparison analog to digital converter as claimed in claim 2, wherein said second input means includes an inverter stage having its output connected to a second input of the AND gate of the same order, each inverter stage, except for the first in the order of inverter gates, having its input connected to the output of the comparison circuit of the preceding order by one, each of said inverter gates having said second logic threshold value.

4. A parallel comparison analog to digital converter as claimed in claim 3, wherein the output of each comparison circuit, except for the first comparison circuit in the order, is applied to a third input of the AND gate which precedes it by one in the order.

5. A parallel comparison analog to digital converter as claimed in claim 1, wherein each of said first input means includes an inverter gate having as its input the output from the comparison circuit of the same order, said inverter gate having said first logic threshold value.

6. A parallel comparison analog to digital converter as claimed in claim 5, wherein each of said logic gates includes a NOR gate having a first input connected to the output of the inverter gate of the same order, each said NOR gate, except for the first of said order, having a second input connected to the output of the comparison circuit which precedes it by one in the order, wherein each said NOR gate serves as said second input means having said second logic threshold.

7. A parallel comparison analog to digital converter as claimed in claim 6, wherein each inverter gate, except for the first in the order, has its output connected to a third input of the NOR gate which precedes it by one in the order.

8. A parallel comparison analog to digital converter, comprising:

a voltage dividing circuit for generating an ordered plurality of comparison voltages;

an ordered plurality of comparators, each comparing an analog signal with the comparison voltages of the same order as the comparator, said comparators producing either one of two binary logic levels when a difference between the analog signal and the comparison voltage applied thereto is relatively large and producing an intermediate level between the two binary logic levels when the difference between the analog signal and the comparison voltage is relatively small;

a position detecting circuit coupled to said comparators for digitizing a value of said analog signal, said position detecting circuit including a plurality of logic gates each having a first logic input terminal receiving an output signal from the comparator of the same order and a second logic input terminal receiving an output signal from the comparator which precedes the gate by one in the order, the logic gate distinguishing the signal applied to the first input terminal thereof into one of the binary logic levels at a first threshold value and distinguishing the signal applied to the second input terminal thereof into one of the binary logic levels at a second threshold value different from said first threshold value, said first and second threshold values being determined in such manner that said intermediate level lies between said first and second threshold levels, wherein the output of said intermediate level from the comparator of a certain order is set at one of the binary logic levels for the first input terminal of the logic gate of said certain order and set at the other of the binary logic levels for the second input terminal of the logic gate of the order which precedes said certain order by one.

9. The converter according to claim 8, in which each of said gates includes an AND gate having a first input terminal and a second input terminal and an inverter having an output coupled to the second input terminal of said AND gate, said first input terminal and the input of said AND gate serving as said first logic input terminal and the input of said inverter serving as said second logic input terminal.

10. The converter according to claim 8, in which each of said logic gates includes a NOR circuit having first and second input terminals, and an inverter having an output coupled to said first input terminal of said NOR circuit, said second input terminal of said NOR circuit serving as said second logic input terminal of said logic gate, the input terminal of said inverter serving as said first logic input terminal of said logic gate.

11. The converter according to claim 8, in which said voltage dividing circuit includes a plurality of resistors connected in series between two different voltages.

12. The converter according to claim 8, in which said decoder circuit includes a read only memory circuit storing Gray code data and a conversion circuit coupled to said read only memory circuit for converting the output of said read only memory circuit to a regular binary coded signal.

13. A parallel comparison analog to digital converter comprising:

a voltage dividing circuit for generating a plurality of ordered comparison voltages; an equal plurality of ordered comparison circuits for comparing said plurality of voltages, respectively, with a common analog input voltage to be digitally converter; a position detecting circuit responsive to the outputs of said plurality of comparison circuits for developing a digital output dependent upon the order of the crossover between those comparison circuits which receive a lower comparison voltage than said common analog input voltage and those comparison circuits which receive a higher comparison voltage than said common analog input voltage, said comparison circuits being of the type which produce a first binary level output when said analog input voltage is sufficiently above said comparison voltage, a second binary level output when said analog input voltage is sufficiently below said comparison voltage, and an intermediate level output when said analog input is neither sufficiently above nor sufficiently below said comparison voltage; the improvement comprising:

first logic circuit means in said position detecting circuit having a first binary threshold level below said intermediate level and second logic circuit means in said position detecting circuit having a second binary threshold level above said intermediate level;

said first logic circuit means including an ordered plurality of inverter gates, each inverter gate having as its input the output from the comparison circuit of the same order and the input terminal of each said inverter gate having a threshold level at which the gate distinguishes between a "0" and a "1" at said first binary threshold level; and said logic circuit means comprises an ordered plurality of NOR gates, each said NOR gate having a first input connected to the output of the inverter gate of the same order, each said NOR gate, except for the first of said order, having a second input connected to the output of the comparison circuit which precedes it by one in the order and the input terminals of each said NOR gate having a threshold level at which the gate distinguishes between a "0" and a "1" at said second binary threshold level.

14. A parallel comparison analog to digital converter as claimed in claim 13, wherein said first binary threshold level is lower than said second binary threshold level.

15. A parallel comparison analog to digital converter as claimed in claim 13, wherein each inverter gate, except for the first in the order, has its output connected to a third input of the NOR gate which precedes it by one in the order.

16. A parallel comparison type analog to digital converter comprising:

a voltage dividing circuit for generating an ordered plurality of comparison voltages;

an ordered plurality of comparators, each comparing an analog signal with the comparison voltages of the same order as the comparator;

a position detection circuit coupled to said comparators for digitizing a value of said analog signal, said position detecting circuit including a plurality of logic gates, each having a first logic input terminal receiving an output signal from the comparator of the same order and a second logic input terminal receiving an output signal from the comparator which precede the gate by one in the order, the threshold values of said first and second logic input terminals being different from each other, and a decoder circuit for generating a digital output in response to the output of said position detecting circuit, wherein each of said logic gates includes a NOR circuit, having a first and second input terminals, and an inverter, having an output coupled to said first input terminal of said NOR circuit, said second input terminal of said NOR circuit serves as said second logic input terminal of said logic gate and the input terminal of said inverter serves as said first logic input terminal of said logic gate.

17. A parallel comparison type analog to digital converter comprising:

means for receiving an analog signal;

a voltage generation circuit for generating a plurality of comparison voltages of different values;

a plurality of comparator circuits, each having a first input terminal receiving said analog signal and a second input terminal receiving an associated one of said comparison voltages, each of said comparator circuits being weighted in an ordered sequence by the comparison voltage applied thereto;

a plurality of logic gates, each having a first logic input terminal receiving an output signal from an associated one of said comparator circuits and a second logic input terminal receiving an output signal from the comparator circuit having the weighting subsequent to that of said associated one of said comparator circuits, each of said logic gates generating an active level output when said first input logic input terminal thereof is at a first logic level and said second logic input terminal thereof is at a second logic level, the threshold values of said first and second logic input terminals of said logic gates being made different from each other; and a decoder circuit coupled to the output of said logic gates for generating a digital output, wherein each of said logic gates includes a NOR circuit, having a first input terminal and a second input terminal, and an inverter circuit, having an output connected to the first input terminal of said NOR circuit, said inverter circuit having an input terminal serving as said first logic input terminal, the second input terminal of said NOR circuit serving as said second logic input terminal, and a threshold value of said inverter circuit being made lower than that of said NOR circuit.

* * * * *

UNITED STATES PATENT AND TRADEMARK OFFICE
CERTIFICATE OF CORRECTION

PATENT NO. : 4,596,978
DATED : June 24, 1986
INVENTOR(S) : Tsuneo Fujita

It is certified that error appears in the above-identified patent and that said Letters Patent is hereby corrected as shown below:

Column 4, line 67, after "20 to 27" delete "comparison circuits so that"

Column 4, line 68, delete in its entirety

Column 5, lines 1-23, delete in their entirety

Column 5, line 24, delete "comparison voltages from nodes 20 to 27"

Column 5, line 47, insert --b-- after "solid line"

Column 5, line 62, delete "143" and insert --431--

Column 7, line 34, delete "$V_{Teff}$ a(W/L)$_D$/(W/L)$_L$ and insert --$V_{Teff} \alpha (W/L)_D/(W/L)_L$--

Column 9, line 68, delete "converter" and insert --converted--

Signed and Sealed this

Fourteenth Day of April, 1987

Attest:

DONALD J. QUIGG

Attesting Officer

Commissioner of Patents and Trademarks